United States Patent [19]
Redwine et al.

[11] 4,321,695
[45] Mar. 23, 1982

[54] HIGH SPEED SERIAL ACCESS SEMICONDUCTOR MEMORY WITH FAULT TOLERANT FEATURE

[75] Inventors: Donald J. Redwine; Lionel S. White, Jr., both of Houston, Tex.

[73] Assignee: Texas Instruments Incorporated, Dallas, Tex.

[21] Appl. No.: 97,106

[22] Filed: Nov. 23, 1979

[51] Int. Cl.³ .............................................. G11C 11/40
[52] U.S. Cl. .................... 365/174; 365/240; 365/200; 365/185
[58] Field of Search .............. 365/240, 174, 189, 200, 365/222, 182, 185; 307/238

[56] References Cited
U.S. PATENT DOCUMENTS
3,930,239 12/1975 Salters ................................ 365/240

Primary Examiner—Terrell W. Fears
Attorney, Agent, or Firm—John G. Graham

[57] ABSTRACT

A semiconductor memory device of the single-chip MOS/LSI one-transistor dynamic RAM cell array type stores both data and address in rows of the array and uses a high speed serial access shift register as its data input/output system. The serial shift register has a number of stages equal to the number of columns in the memory cell array, and data in the shift register is transferred into or out of the columns of the array when a comparator indicates that an address input matches the stored row address. The rows are sequentially activated by a commutator, so no row or column decoders are needed. The device may be made fault tolerant by use of an electrically programmable floating gate transistor connected to each row, and programming this transistor to blank input or output if the row includes bad cells. The fault tolerant feature is transparent to the computer system using the memory.

23 Claims, 6 Drawing Figures

HIGH SPEED SERIAL ACCESS SEMICONDUCTOR MEMORY WITH FAULT TOLERANT FEATURE

RELATED CASES

The subject matter of this application is related to that disclosed in co-pending applications Ser. Nos. 097,104, 097,105 and 096,957, filed herewith and assigned to Texas Instruments.

BACKGROUND OF THE INVENTION

This invention relates to semiconductor integrated circuit memory devices and more particularly to a high speed, serial access, fault tolerant, memory system which may use an MOS/LSI random access read/write memory cell array.

Semiconductor memory devices of the type made by the N-channel silicon-gate MOS process and employing one transistor dynamic cells are now perhaps the most widely used in computers and digital equipment. The volume of manufacture of such devices has resulted in a continuing reduction in cost according to "learning curve" theory, and this trend will continue as volume increases. In addition, improvements in line resolution and other factors have made possible increases in bit density during the last few years so that 64K bit devices are now in production, and 256K devices are being designed. Increased bit density has further reduced the cost per bit for this type of computer memory, and cost reductions will continue.

Ordinarily a computer of any size, whether main frame, minicomputer, or microcomputer, will have several different types of memory. These types may include cache, dynamic RAM, static RAM, EPROM, EAROM, ROM, buffer, magnetic bubble, CCD, several types of disc including fixed head and moving head disc, and magnetic tape. Generally the high speed access types are the most expensive and the lower speeds are cheapest, on a per bit basis. Other factors such as ease of programming, volatility, refresh overhead, size, power dissipation, etc., dictate choice of one type over another. One of the most common in current mainframe computers is moving head disc, which is relatively inexpensive, but the access time is slow. Fixed head disc has thus been used as a speed buffer between moving head disc and RAM, at a cost less than RAM but somewhat more than moving head disc.

Different manufacturing methods and equipment, different design efforts for product improvement, and different technology bases have caused the various types of computer memory to fail to take maximum advantage of the economics of scale. For example, one niche is the realm of memory is occupied by CCD's which are serial semiconductor devices adapted to the task of going from moving head disc to RAM, replacing fixed head disc. In spite of the fact that CCD's are basically similar to N-channel MOS RAM's, the vast design and manufacturing expertise available for the mainstream memory products shared by major semiconductor manufacturers has not been applicable to CCD's because of the different technologies. Thus, this memory product has not kept pace in the areas of manufacturing volume, cost reduction, and bit density increases. For this reason, computer equipment manufacturers have made use of standard dynamic RAM devices to simulate operation of CCD's to accomplish the function of buffering between moving head disc and RAM. This is somewhat cheaper, but the unused speed of dynamic RAM's results in unnecessary costs. These considerations resulted in the serial access memory device of pending applications Ser. No. 097,104 now abandoned, and Ser. No. 096,957, filed herewith now U.S. Pat. No. 4,281,401 and assigned to Texas Instruments.

An evaluation of the usage of various memory types by a CPU in typical computing systems shows that high speed RAM is not needed for direct interface with the CPU during substantial parts of commonly-used operations. Instead, high speed serial access memory is very useful in transfering blocks of data into cache or into the working registers of the CPU itself. Thus, in addition to high speed RAM, it would be desirable to have available high speed serial access memory devices which may be used as an alternative. The continuing investment in dynamic MOS RAM technology, plus the serial operation provided by the serial access RAM of applications Ser. Nos. 097,104, 097,105 and 096,957, present the capability of combining serial access with random access memory technology with substantial cost advantages.

Reduction in bar size usually results in lower cost because there are more bars per slice and also increased yield if a given probability of a defect per unit area is assumed. A significant area on the bar is needed for X and Y address decoders in a standard dynamic RAM. An addressing scheme which eliminates these decoders would be of significant aid in reducing bar size and cost.

The yield of good bars per slice in semiconductor manufacture is of continuing concern. Usually over the lifetime of manufacture of a product, the yield increases, perhaps from near zero at the beginning to over 50% when the product is mature. At the upper end of this range the product may be of low cost and quite profitable, but in the beginning low yield means high cost and high numbers of scrap bars. If some of the scrap could be salvaged, especially in the beginning of production, then substantial savings in cost and much earlier delivery of parts would result. To this end, various fault tolerant memory configurations have been devised, such as shown in U.S. Pat. No. 3,988,777 issued to Choate and assigned to Texas Instruments. Many of these, however, have been costly in bar size to implement and reduced operating speed of the memory devices.

It is the principal object of this invention to provide a high speed serial access memory system which is especially useful for implementing in semiconductor MOS/LSI devices. Another object is to provide an improved fault tolerant memory, particularly for serial access memory devices which are of lower cost and susceptible of volume production. An additional object is to provide an improved MOS/LSI memory device of high bit density at low cost.

SUMMARY OF THE INVENTION

In accordance with one embodiment, a semiconductor memory device of the single-chip MOS/LSI one-transistor dynamic RAM cell array type stores both data and address in rows of the array and uses a high speed serial access shift register as its data input/output system. The serial shift register has a number of stages equal to the number of columns in the memory cell array, and data in the shift register is transfered into or out of the columns of the array when a comparator indicates that an address input matches a stored row address. The rows are sequentially activated by a commutator, so no row or column decoders are needed. The device may be made fault tolerant by use of an electrically programmable floating gate transistor connected to each row, and programming this transistor to blank input or output if the row includes bad cells. The fault tolerant feature is transparent to the computer system using the memory, since a match does not occur until the commutator comes to a physically good row with the proper address stored.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompany drawings, wherein:

DETAILED DESCRIPTION OF SPECIFIC EMBODIMENT

Figure 1:
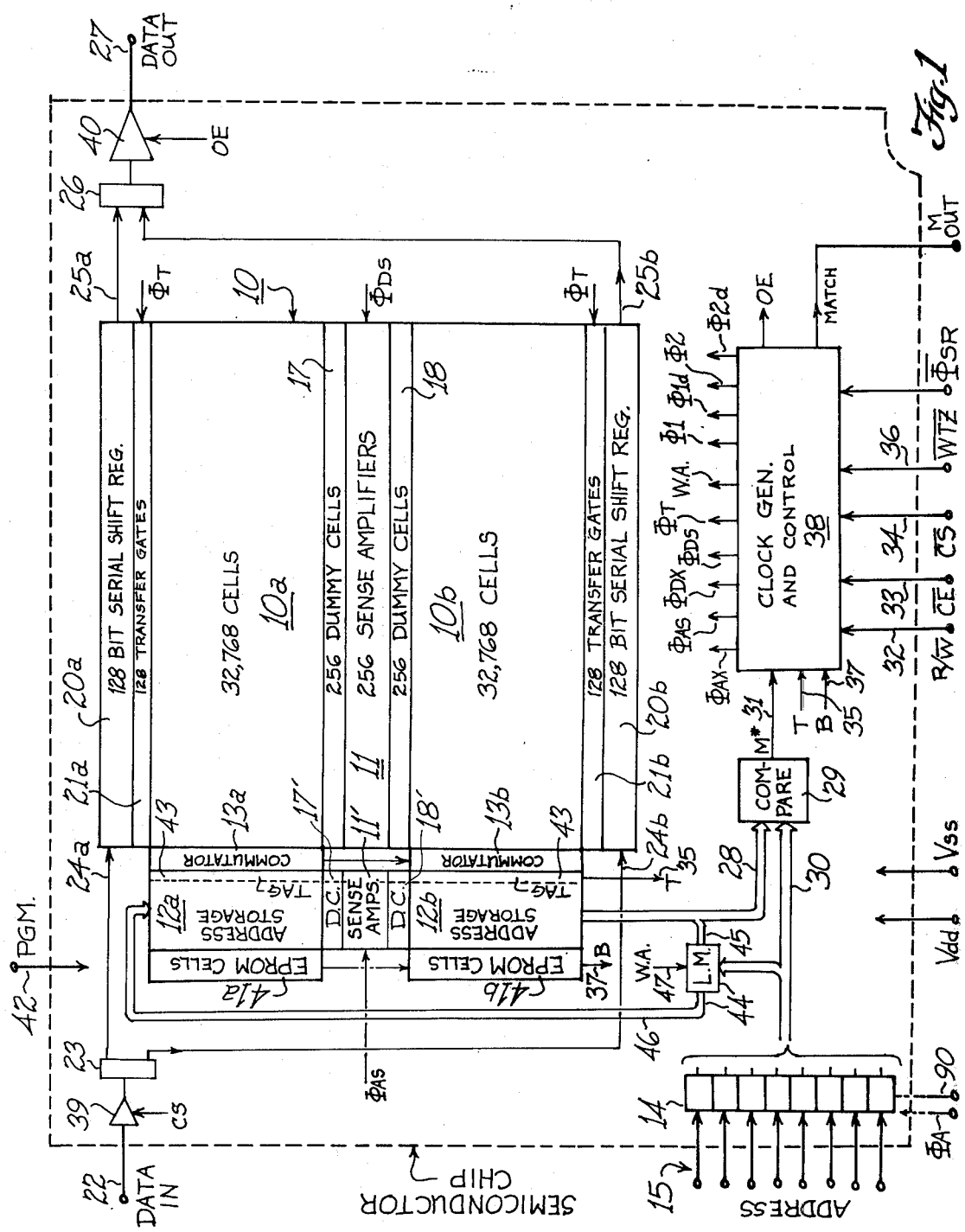
FIG. 1 is an electrical diagram in block form of a semiconductor memory device which uses the features of the invention.

Referring to FIG. 1, a memory device which illustrates the features of the invention is shown in block diagram form. This is basically serial access, read/write memory using a cell array of the dynamic random access type. It is made by an N-channel, self-aligned, silicon gate, double-level-polysilicon, MOS process. All of the memory device of FIG. 1 is included in one silicon chip of about 1/30 of a square inch in size which usually would be mounted in a standard dual-in-line package. The device includes in this example an array 10 of 65,536 memory cells, with the array split into two halves 10a and 10b of 32,768 cells each, in a regular pattern of 256 rows (extending left to right in FIG. 1) and 256 columns (vertical in FIG. 1). Of the 256 rows or X lines, there are 128 in the array half 10a and 128 in the half 10b. The 256 column or Y lines are each split in half with one half being in each of the halves 10a and 10b. There are 256 sense amplifiers 11 in the center of the array plus a number of sense amplifiers 11' for the address bits; these are differential type bistable circuits which may be made according to the invention disclosed and claimed in U.S. Pat. No. 4,081,701, issued to White, McAdams and Redwine, or application Ser. No. 944,822 filed Sept. 22, 1978, both assigned to Texas Instruments, or may be other standard dynamic RAM sense amplifiers shown in the below-mentioned Electronics articles. Each sense amplifier is connected in the center of a column line, so 128 memory cells are connected to each side of each sense amplifier 11 or 11' by a column line half. The chip typically requires only a single 5 V supply Vdd, along with a ground terminal Vss. An address storage array, which is split into two halves 12a and 12b, is laid out with but separate from the array 10a and 10b. That is, the address storage array is like an extension of the cell array 10a and 10b. One of the 256 row lines in the array 10a,10b,12a,12b is activated at any one time by a bit circulating in a 256 bit commutator register 13a, 13b. A set of address buffers or latches 14 made according to the invention disclosed in pending application Ser. No. 953,145 filed Oct. 20, 1978, by Reese, White and McAlexander, assigned to Texas Instruments, receives a multi-bit X address at TTL voltage levels applied to input terminals 15. Commutator 13 functions to select one of the 256 row lines in arrays 10a or 10b, but the address stored in array 12a or 12b for this row line may or may not match an address defined by this multi-bit address on the input terminals 15. If the row line selected by the commutator register 13 is in the half 10b of the cell array then a row of dummy cells 17 on the opposite side of the sense amplifiers 11 is also activated, while if a line in the half 10a is selected then a row of dummy cells 18 is activated, in the manner typical of dynamic RAMs. The memory device is similar to a standard dynamic RAM with no X or Y decoders. Serial input/output using a shift register according to the concepts disclosed in said copending applications filed herewith is employed for I/O. A serial shift register is used, the register being split into two identical halves 20a and 20b with the halves positioned at opposite sides of the array. The shift register may be loaded from the column lines of the array 10 for a read cycle by transfer gates 21a on one side and a like number of gates 21b on the other side of the array; similarly the register data may be loaded into the column lines via the gates 21a and 21b for a write cycle. Data input to the device is by a data-in terminal 22 which is connected through a buffer and a multiplex circuit 23 to inputs 24a and 24b of the register halves. Data is read out serially from the register halves 20a and 20b by lines 25a and 25b to a data-out multiplex circuit 26, a buffer, and a data-out terminal 27. The shift register 20a and 20b is operated by a clock $\Phi$SR which shifts the bit on the input 22 through the stages of the register. A control $\Phi$T operates the transfer gates 21a and 21b, moving data between shift register and 256 column lines in the array halves 10a and 10b.

The address storage arrays 12a, 12b contain 256 rows, just like the arrays 10a, 10b, and contain a number of columns chosen according to the maximum number of bits in the addresses used in the system. An eight bit address defines one of 256 rows, so in the 64K bit chip configuration shown for illustration, an eight bit address is adequate. A memory board may contain, for example, eight of the chips of FIG. 1 in parallel for serial-access storage of 64K bytes or words of data; likewise, for 16-bit or 32-bit words, sixteen or thirty-two chips would be used in parallel instead of eight. In the case of eight chips, a given 8-bit address would produce an output of 256 8-bit bytes in bit-parallel, byte-serial format. By the use of a chip select function the memory may be expanded in increments of eight (or sixteen or thirty-two) chips each. Such use of eight chips, as in a conventional byte organized memory, implies that the commutator of each chip must shift through 256 cycles in order to locate a given address; the commutators might not be synchronized among the eight chips, so the system must wait out a full 256 cycles to make sure all are ready to shift out. Thus, this type of organization is not preferred. An optimum organization of the memory described herein is one of a serial memory in which the data is stacked in pages of 256 bits (32 bytes) and it is desired to access one page (32 bytes) at a time. That is, the selected row of 256 bits is accessed as 32 bytes in serial. In this case, expansion of the address field allows direct expansion of the memory size, without chip select logic. For example, a 12-bit address field would allow a module size of 4,096 pages ($2^{12}=4,096$) of 256 bits (32 bytes) each. This module thus has a total of 131,072 bytes or 1,048,576 bits of storage, and the advantageous feature of this organization is that the data is available for shift out as soon as it is found by the matching process.

When the bit in the commutator 13a, 13b dwells on a given row line, the eight bits (or more depending on the address width as just explained) stored in this row in the address arrays 12a, 12b is sensed by operation of the sense amplifiers 11' by $\Phi AS$ and coupled via lines 28 to a comparator 29. The comparator 29 also receives the address in the latches 14 as its other input 30, and produces a match signal M* on a line 31 if the two inputs 28 and 30 are the same. A read/write control input signal $R/\overline{W}$ is applied to the chip at a terminal 32. Other control inputs are a chip enable signal $\overline{CE}$ on an input terminal 33 and a chip select signal $\overline{CS}$ on a terminal 34. The $R/\overline{W}$, $\overline{CE}$, and $\overline{CS}$ signals and match signal M*, plus a tag bit T on line 35 and "write tag zero" on an input terminal 36, and a fault tolerant blanking signal B on a line 37, are used in a control logic circuit 38 to generate the transfer signal $\Phi T$ and the sense signals $\Phi AS$, $\Phi DS$ as well as output enable signal OE. A buffer 39 at the input receives the chip select signal CS as one input and allows the serial data input on pin 22 to pass through to the input of the multiplex circuit 23 only if CS is high. Likewise, a tristate buffer 40 at the output receives the output enable signal OE as one input and applies the output of the multiplex circuit 26 to the data out pin 27 only if OE is high.

A set of 256 EPROM cells, split into two sections 41a and 41b, provides fault tolerant operation. The EPROM cells have their source-to-drain paths all connected from a supply and load to ground, and the output across the load is the B signal on the line 37. The control gates of the EPROM cells are connected to the 256 row lines for the address storage arrays 12a, 12b so where a given row is actuated by the bit in commutator 13a, 13b dwelling on this row, then the EPROM cell for this row will be potentially turned on (all other rows will be off). If the floating gate of this cell is not charged, the cell will turn on and the line 37 will be held at ground so the blanking signal B is not actuated; this means that the row currently addressed is good. However, if a previous testing procedure has revealed that one or more bad cells exist in the data storage array for this row, then this row will not be used and will be blanked out for write or read by charging the floating gate of its EPROM cell 41a, 41b. When the floating gate is charged, a voltage on the control gate of this cell occurring when this row is addressed by the commutator 13a, 13b will not turn on the EPROM transistor and the voltage on the line 37 will go high so the blanking signal B is actuated. Programming the EPROM cells is accomplished by applying a high voltage Vp (typically about 25 V.) to a program pin 42 while the bit in the commutator 13a, 13b dwells on a bad row. This causes large current flow to ground through the source-to-drain path of this transistor and charges the floating gate by electron tunnelling.

The commutator 13a, 13b is a shift counter clocked by $\overline{CE}$ which is shown as an input to the chip on pin 33. The commutator is designed to come on with only one bit (in a given position such as the first stage) high and the others low when power Vdd is first applied to the chip. Usually there is no need to know the physical location of a row assigned a given address, but if desired it is possible to keep count of the number of $\overline{CE}$ pulses so that the row upon which the recirculating bit dwells can be determined. After manufacture of the chip, it is tested by clocking the commutator forward one row at a time as test data is read in and read out for each row; if the test fails the row is eliminated before clocking forward by applying a programming pulse Vp to the pin 42 while the bad row is still actuated by the commutator. Thereafter, this row cannot be written into or read out of because whenever the bit in the commutator dwells on this row a blanking signal B occurs.

When the bit in the commutator 13a, 13b dwells on a given row, the row line in the address storage array 12a, 12b is activated first by $\Phi AX$ so that the stored address will be immediately available at the lines 28 for compare. Then if the compare is valid, the same row line in the data array 10a, 10b is activated by $\Phi DX$.

The address storage array 12a, 12b contains one column 43 for "tag" bits; the tag bit for a row is set to one when an address is written in, otherwise it is zero. Thus, when initially using the memory after power up, all address locations contain zeros, and as the addresses are assigned, and written in, the tag bits are set to one. Thereafter when searching for an unused address location it is merely necessary to check for zero in the tag bit rather than examining all bits of the address in a row of the array 12a, 12b.

The sense amplifiers 11' for the address storage array 12a, 12b are activated by a signal $\Phi AS$ separate from an activating signal $\Phi DS$ for the sense amplifiers 11 for the data storage array 10a, 10b. The sense amplifiers 11' have dummy cells 17' and 18' just as in the data storage array; these dummy cells operate in the same manner as in current dynamic RAM devices.

An address is loaded into a row of the address storage array 12a, 12b from the latches 14 via lines 30 and a "load memory" control circuit 44 which directs the address bits onto lines 45 and the complement of the address bits onto lines 46 when a "write address" signal W.A. is applied to an input 47. The write address signal W.A. is generated in the control circuitry 38 in response to the match signal M and the write-tag-zero command $\overline{WTZ}$.

Figure 2:
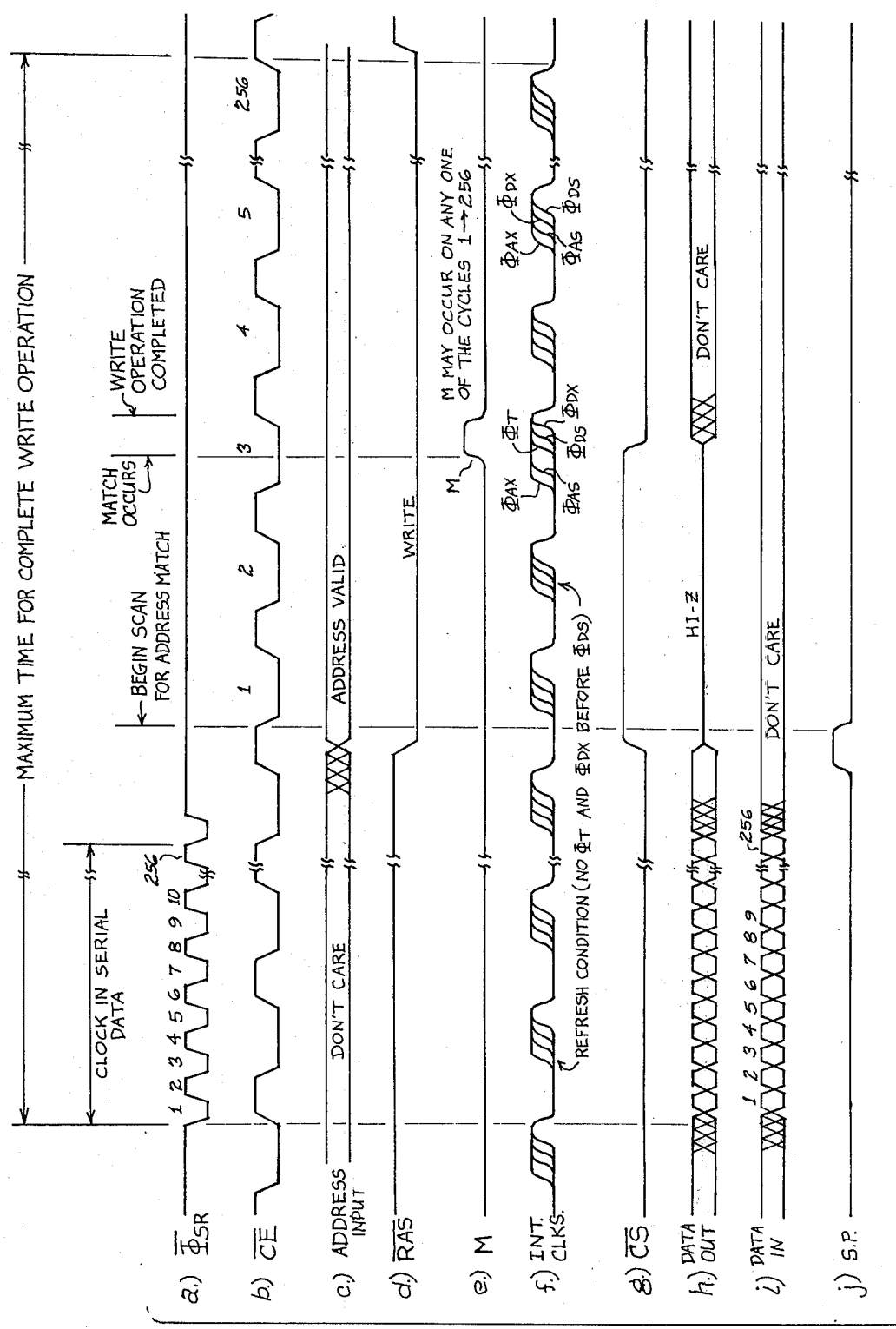
FIGS. 2a-2t are graphic representations of voltage vs. time or other conditions vs. time existing for various parts of the device of FIG. 1.

A write sequence will now be explained for one mode of operation. First, a serial data word is applied to the input pin 22 as seen in FIG. 2i. This word consists of 256 bits of data to be stored in the 256 cells in one row of the array 10a, 10b. A multi-bit address to be stored in this same row of cells in the address array 12a, 12b is later applied to the pins 15 as seen in FIG. 2c. As the 256 bits of data is serially applied to the pin 22, the shift register 20a, 20b is advanced 256 bits, which requires 128 of the clock $\Phi SR$ pulses. This serial data word passes through the buffer 39 and is split into two data streams on the lines 24a and 24b, alternating bit by bit. Thus, the data is fed into the split shift register 20a, 20b so the 256 bits of data will be stored in the 128 stages 20a on one side of the array 10, and the 128 stages 20b on the other side. After the registers are loaded, and the next $\overline{CE}$ has occurred as seen in FIG. 2b the latches 14, triggered by controls derived from $\overline{CE}$, accept the multi-bit address on the lines 15. A clock derived from $\overline{CE}$ advances the commutator 13a, 13b one step at a time, and a $\Phi AX$ signal followed by a $\Phi AS$ signal occurs after each CE clock as seen in FIG. 2f so that the sense amplifiers 11' are operated each time the commutator advances, causing the address stored in the arrays 12a, 12b for the actuated row line to be read out on the lines 28 as an input to the comparator 29. When the two are the same the match signal M* occurs and ΦT is produced by control 38, causing the transfer gates 21a,21b to load the bits in the shift register 20a,20b onto the column lines of the array 10. The ΦDS signal occurs, bringing column lines to full logic level, and ΦDX or the row line voltage for the row selected by the bit in the commutator 13a,13b goes high so the 256 bits of data are written into the cell capacitors for this row.

In a write sequence for another mode of operation, the address storage array doesn't contain a previously stored address corresponding to the address loaded into the latches 14. This occurs if the memory hasn't been written into yet, such as when the computer has just been powered up or else a new program is loaded after zeroing all memory. In this condition a compare signal M* will never be reached. The write tag zero signal $\overline{WTZ}$ is low, no match signal M* or blanking signal B occurs, and tag bit T is low; this produces a transfer signal ΦT to cause the 256 bits in the register 20a,20b to be loaded onto the column lines of the array 10. While ΦDS and ΦDX are high, a load address command W.A. is produced which controls a gate 44 to allow the address on the lines 30 to be applied to the column lines of the address storage array 12a,12b. Then, ΦAS and ΦAX will store this address in the cells for this currently-actuated row. Later ΦDS and ΦDX cause data to be stored.

The addresses stored in the address storage array need not be in sequential order but instead may be in arbitrary order. The count in the commutator (i.e. the row number) need not agree with the address stored in this row. The bad rows will not be used, but also will not be assigned an address, so the fault tolerant operation is transparent to the CPU. The CPU does not have to keep account of what addresses are bad. When chips are tested, they are sorted as to the number of bad rows, so when memory boards are made up the chips are selected to provide at least as many good addresses as specified for a given board.

A read operation begins with an address on the lines 15 which is latched into buffers 14 when $\overline{CE}$ occurs as seen in FIG. 2l. The R/W control is high, as seen in FIG. 2n. The address must be valid during a period as seen in FIG. 2m. The $\overline{CE}$ clocks occur as seen in FIG. 2l until a match signal M occurs; this could require from zero to 256 $\overline{CE}$ pulses. When the address read out of the array 12a, 12b on lines 28, upon occurrence of ΦAS after each $\overline{CE}$, matches the address on the lines 30, the signal M* on line 31 causes the control 38 to generate a ΦT command. The data on the 256 column lines via the array 10 is thus loaded into the shift register 20a, 20b via transfer gates 21a, 21b. The shift clock ΦSR begins (immediately if triggered by the CPU as initiated by an output signal "M out" on pin M or later in the simplest configuration where the maximum time of 256 $\overline{CE}$ clocks is waited out so no pin M is needed) and continues for 256 cycles as seen in FIG. 2k to move the data out via multiplex circuit 26, buffer 40 and pin 27, as seen in FIG. 2r.

Refresh occurs every time the commutator 13a, 13b addresses another row. Thus, during the time when the shift register halves 20a and 20b are being loaded from data-in pin 22 or being read out through data-out pin 27, refresh can be occurring by clocking the commutator by $\overline{CE}$. The shift register 20a and 20b is not disturbed by a refresh operation so long as ΦT does not occur. Also, note that serial data can be shifted into the register halves 20a and 20b while data is being shifted out, and so a write operation can begin just after a read operation is initiated.

Figure 3:
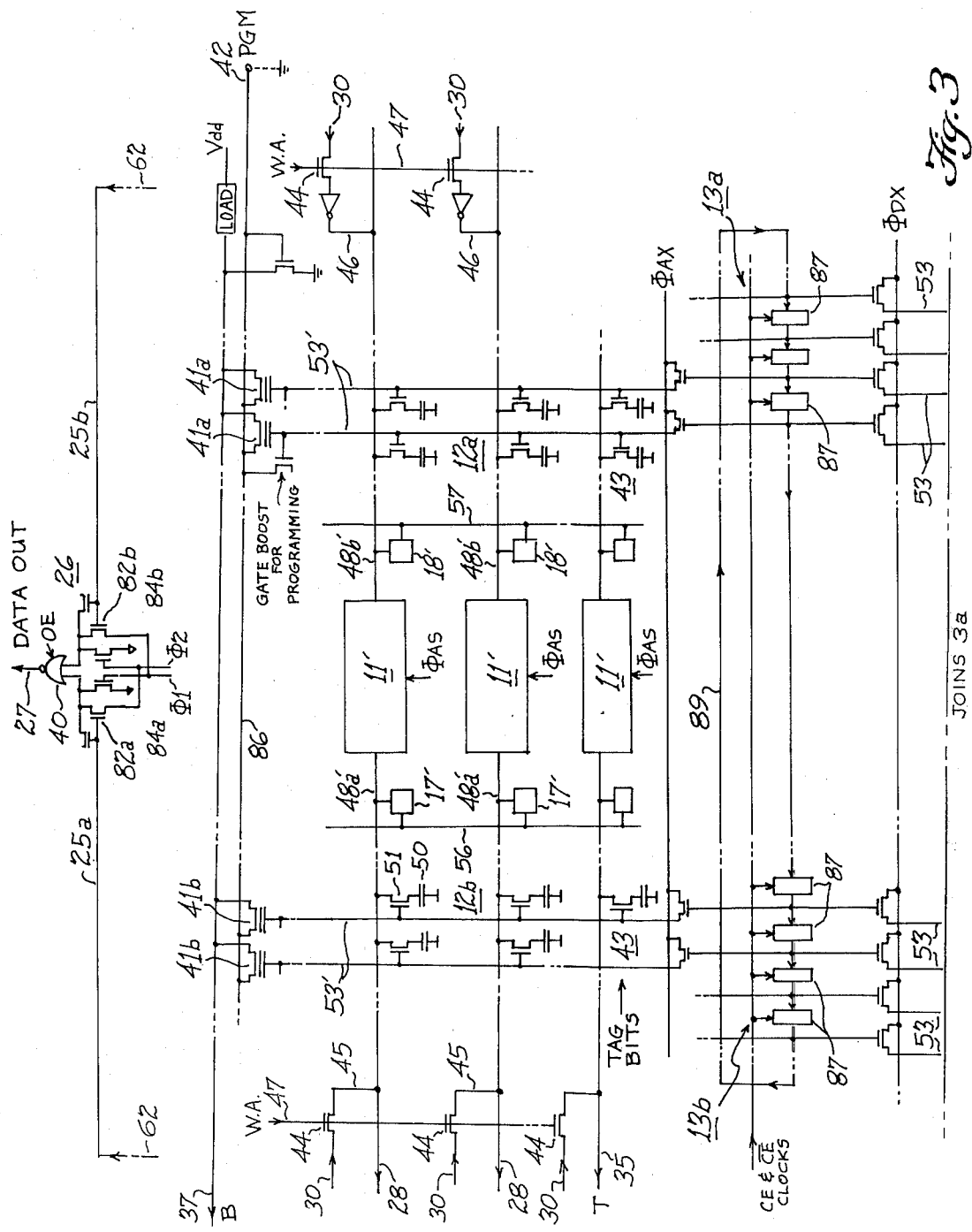
FIGS. 3, 3a are electrical schematic diagrams of parts of the cell array in the device of FIG. 1.
Figure 3A:
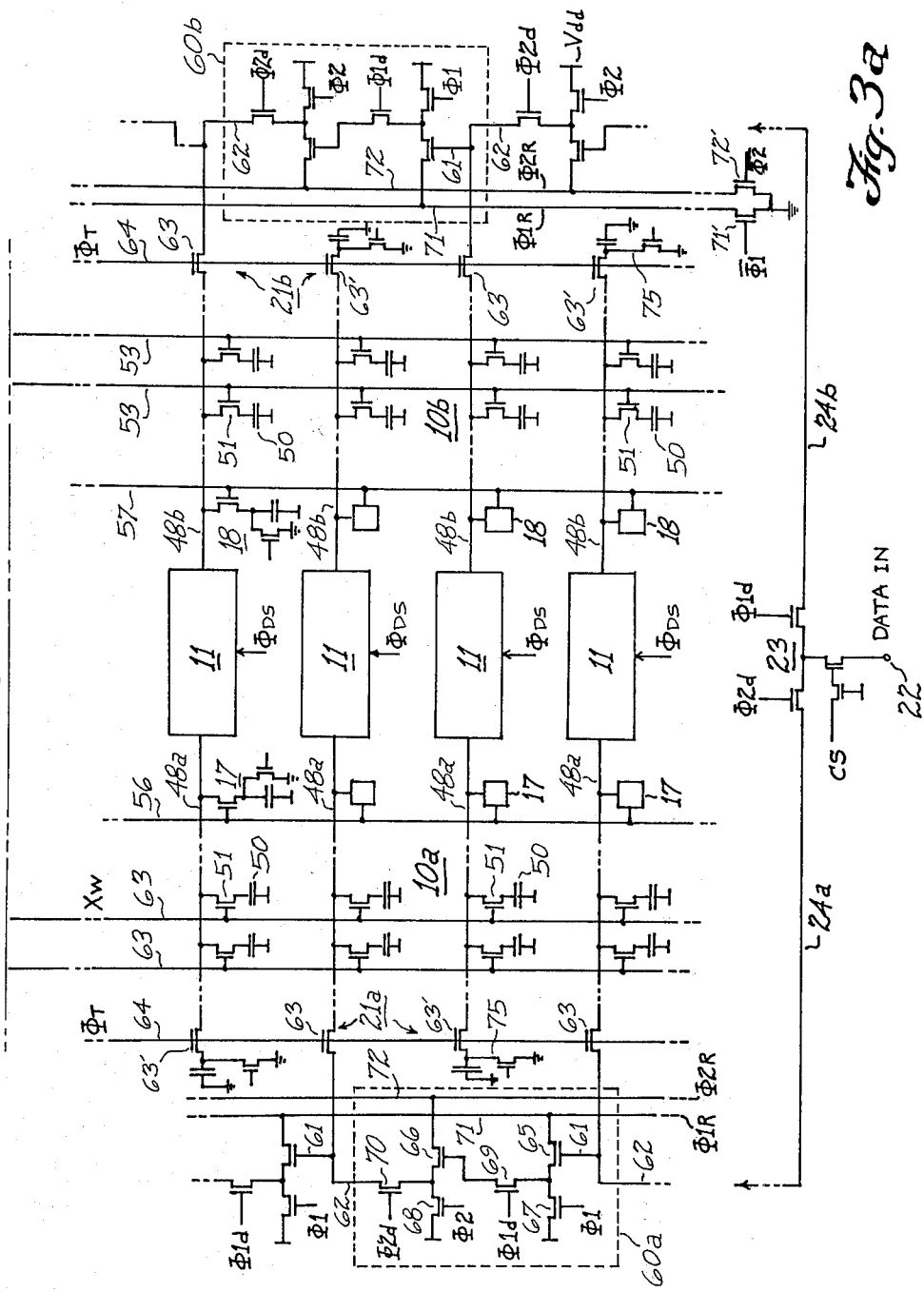

In FIG. 3a, a portion of the cell array 10 and address memory 12a, 12b, and associated shift register stages and commutator are shown in schematic form. Four of the 256 identical sense amplifiers 11 positioned at the center of the array 10 are shown connected to four column line halves 48a or 48b. Connected to each column line half 48a or 48b are 128 one-transistor cells each having a storage capacitor 50 and a transistor 51. The cells are of the type described in pending U.S. patent applications Ser. No. 648,594, filed Jan. 12, 1976 and Ser. No. 722,841, filed Sept. 13, 1976 by C-K Kuo, both assigned to Texas Instruments, or U.S. Pat. No. 4,012,757, or in Electronics magazine of Sept. 13, 1973 at pp. 116-121, Feb. 19, 1976 at pp. 116-121, May 13, 1976 at pp. 81-86 and Sept. 28, 1978 at pp. 109-116. Row lines 53 which are from outputs of the commutator 13a, 13b are connected to the gates of all of the transistors 51 in each row; there are 256 identical row lines 53 in the array. Also connected to each column line half 48a or 48b is a dummy cell 17 or 18 which consists of a storage capacitor, an access transistor and a grounding transistor. The gates of all access transistors of dummy cells in a row are connected to a line 56 or 57. When the commutator selects one of the lines 53 on the left, the associated transistor 51 is turned on to connect the capacitor 50 for this selected cell to the column line half 48a, while at the same time the dummy cell select line 57 on the opposite side is activated, connecting the capacitor in one of the cells 18 to the column line half 48b, just as in a dynamic RAM.

The serial I/O register 20a and 20b is composed of shift register stages 60a or 60b positioned on opposite sides of the cell array. The input 61 of each stage is connected to receive the output 62 of the next preceding stage, in the usual manner. The register is operated by a two phase clock Φ1, Φ2, plus delayed clocks Φ1d and Φ2d, which are derived from the clock $\overline{\Phi SR}$ supplied from external to the chip. That is, the clock $\overline{\Phi SR}$ is used to generate another clock in phase opposition then each of these is used to generate the delayed clocks. The input 24a or 24b of the first of the stages 60a or 60b is from the data-in multiplex circuit 23, and the output from the last of the stages 60a or 60b goes to the data-out multiplex circuit 26. The transfer gates 21a or 21b consist of 256 identical transistors 63 having their source-to-drain paths in series between the column line halves 48a or 48b and the shift register stages 60a or 60b. The gates of the transistors 63 are connected by a line 64 to the ΦT source.

According to the invention of copending application Ser. No. 096,723, filed herewith, the stages of 60a or 60b of the shift register are of the four-phase dynamic ratioless type, with improved noise margin and speed characteristics. Also, the shift register stage uses minimum size transistors and dissipates low power. Although four phases are used, two of the clocks Φ1 and Φ2 are the standard two-phase mutually exclusive clocks used in most memory systems. The other two clocks Φ1d and Φ2d are easily derived from the first two. Each stage consists of first and second inverter transistors 65 and 66 with a clocked load transistor 67 or 68 for each inverter. A transfer transistor 69 or 70 couples each inverter to the next. The drains of loads 67 and 68 go to +Vdd, and the sources of inverter transistors 65 and 66 are connected to Φ1R or Φ2R on lines 71 and 72. These are not additional clocks but instead Φ1R and Φ2R represent connections to Vss at Φ1 and Φ2 transistors 71' and 72'.

The shift register stages are connected to alternate ones of the column lines 48a or 48b on each side. This provides an advantage in that the six transistors per stage may be more easily laid out to fit between the two alternate column lines rather than between adjacent column lines. The pitch in a dynamic RAM array of the type to be adapted to use the features of the invention is about 0.8 mil; a greater layout area for the six transistors of a shift register stage is available in 2×0.8 or 1.6 mils. The same result could be accomplished by placing both halves 60a and 60b of the split shift register on the same side of the array, but laid out one above the other. Alternatively, the shift register need not be split at all, but instead may be a single serial register, but the data rate would be half as fast.

A dummy transfer transistor 63' is positioned at the end of each column line when not used on that side to connect to a shift register stage. This electrically and physically balances the inputs to the sense amplifiers 11 and also connects to a dummy cell 75 which functions when sensing the voltage transferred from the register 20a, 20b.

A data-in multiplex circuit 23 for directing alternate bits to the inputs 24a or 24b includes a pair of transistors 80a and 80b which have gates driven by Φ1d and Φ2d. A transistor 81 in series with these has input enable signal CS on its gate, so data only goes into the shift register at the selected time. A data output multiplex circuit 26 includes transistors 82a and 82b having Φ1 or Φ2 on their drains and the last stage outputs 25a or 25b on their gates; gated capacitors couple the gates to sources. Transistors 84a and 84b short the output of one to Vss when the other is valid, being driven by Φ1 and Φ2. A NOR gate 40, actuated by OE, produces the output to terminal 27.

The data-in or data-out rate is twice the clock rate $\overline{\Phi SR}$. Only 128 $\overline{\Phi SR}$ cycles are needed to transfer in or transfer out 256 bits, due to the fact that the shift register is split. Two clocks are needed to shift a bit of data one position, so if all 256 stages were in series, then 256 clock cycles would be needed. A memory device of this type using present specifications can be clocked at about 10 MHz maximum, so a data rate of 20 MHz is possible. This is higher than typical CCD's, for example.

The timing of the ΦT, ΦDS and ΦDX signals is different for read, refresh and write. The voltages are seen in FIGS. 2f and 2p; read and refresh are generally the same except refresh has no ΦT, but for write the timing is reversed because of the different sequence. In the case of a read cycle the data from a row of the memory capacitors 50 is transferred due to ΦDX through a row of transistors 51 to the column lines 48a and 48b, then detected by the sense amplifiers 11 at ΦDS, then loaded through the transfer gates 21a and 21b at ΦT to the shift register 20a and 20b. The opposite must occur for the write cycle where the transfer devices 21a and 21b must turn on first at ΦT as the data in the shift register is transferred to the column lines 48b, then data is sensed at ΦDS, after which ΦDX goes high momentarily to turn on a selected row of transistors 51 and thus load the data state of the serial shift register into the row of capacitors 50 in the cell array 10. The proper sequence is selected during $\overline{CE}$ in response to the $\overline{R/W}$ command and the match signal M by the circuitry of FIG. 4 which is part of the clock and control generator 38. ΦT, generated in response to M, T, $\overline{CE}$, $\overline{WTZ}$, and B, is switched in timing between early or late depending upon whether $\overline{R/W}$ is low or high.

The fault tolerant system is seen in FIG. 3 as a series of 256 floating gate EPROM transistors 41a and 41b, each having its control gate connected to one of the row lines 53', and each having its source connected to Vss via line 86. The drains are connected to the line 37 which is the B output to the control 38 and is also connected through a load to Vdd and to the program input 42. The transistors 41a, 41b may be of the type disclosed in U.S. Pat. Nos. 4,122,509 or 4,122,544, assigned to Texas Instruments, or in U.S. Pat. No. 3,984,822.

The commutator 13a, 13b as shown in FIG. 3 consists of 256 identical shift counter stages 87, (each of which is clocked by $\overline{CE}$ and CE, not shown) so that a bit or logic "1" is advanced by one stage for each $\overline{CE}$ cycle. The output of each stage 87 is coupled to the input of the next stage and also coupled through gates to the row lines 53 and 53'. The output of the last stage 87 is connected back to the input of the first stage by a line 89 so the bit continuously recirculates. The commutator is constructed (by means known in this technology) so that all bits will come up zero on power up except the first stage, whereby all of the chips can be synchronized by controlling the number of clock pulses $\overline{CE}$ applied to the chips (this is not needed, ordinarily).

FIG. 3 shows a small representative sample of the address memory array 12a, 12b which consists of cells essentially the same as in the array 10a, 10b with dummy cells 17', 18' and a sense amplifier 11' at the center of each column 48'a, 48'b. The lines 48'a are connected to the address output lines 28 and also to the address input lines 30 via transfer gates 44 controlled by the load memory command W.A.

Although shown as a 256×256 array of 64K bits of data memory, the same concepts would apply to a larger memory such as a 512×512 array of 256K bits (262,144 bits), or a smaller array. Also, optimum performance might be obtained with partitioning of other than equal numbers of rows and columns, perhaps 1024×256.

Parallel address inputs 15 are shown, but little sacrifice in speed occurs if a serial address input 90 were used along with a clock ΦA to clock in the address, using two pins instead of eight to twelve pins 15. If the process yield was high, the fault tolerant feature using the cells 41a, 41b could be eliminated, so the pin 42 would not be needed. So, a device may be constructed according to the invention using a ten pin package, or eight pin if clocks $\overline{CE}$, $\overline{\Phi SR}$ and ΦA are combined or multiplexed and pin M not used.

Figure 4:
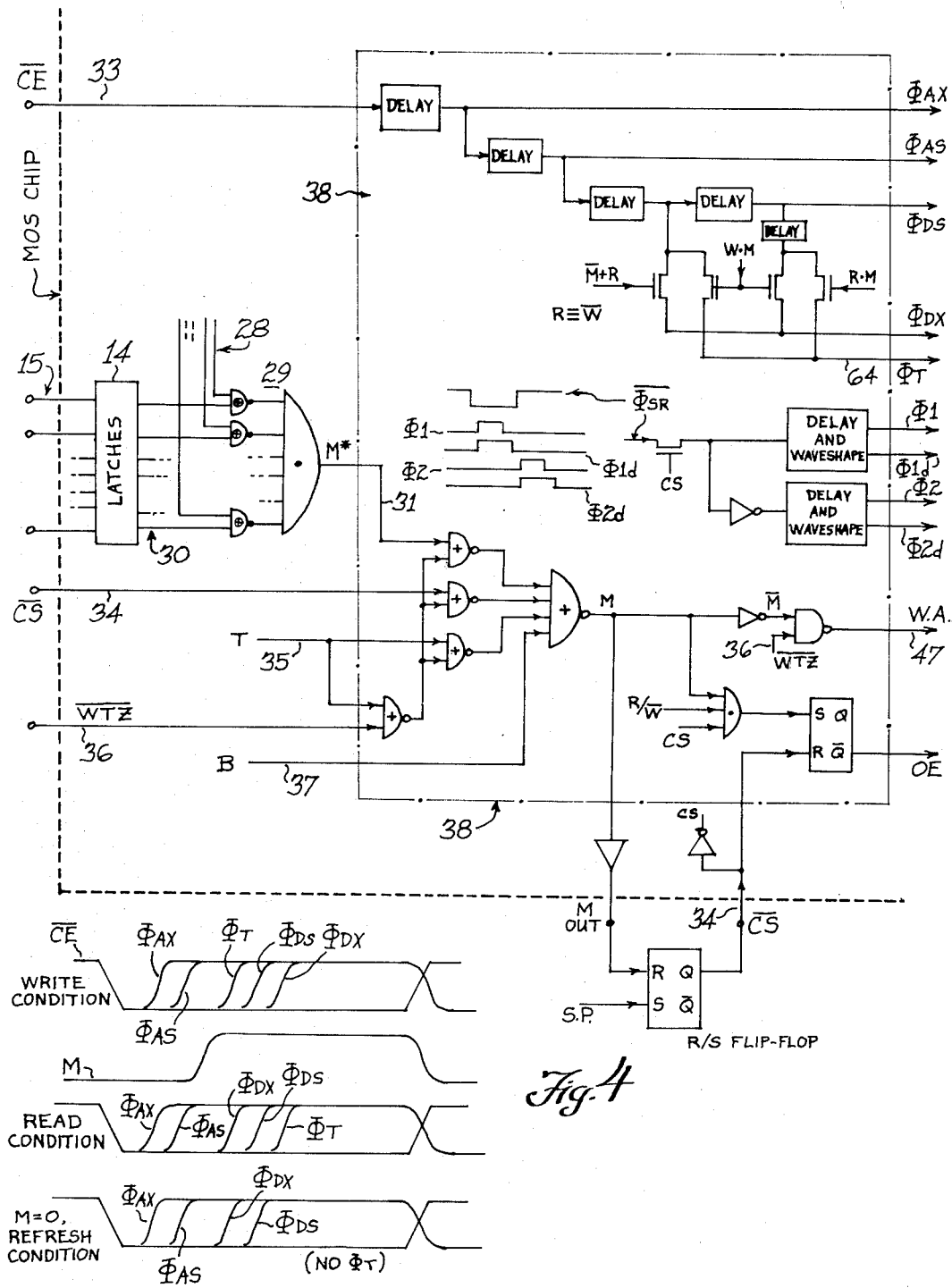
FIG. 4 is a showing of the logic circuitry for the clocking and control circuits.

FIG. 4 shows the logic needed to generate the various clocks and controls in the circuitry 38. In another embodiment, the cells in the address memory array 12a, 12b are EPROM rather than DRAM cells, in which case the FT cells 41a, 41b are not needed. The addresses are permanently written into the array 12a, 12b as a last step in manufacture of a memory device or board, at the time of testing, so bad rows are skipped, i.e., no address is written in. Thus, upon subsequent use, the bad rows will never be used because no match signal will occur. Such rows cannot be written into nor read out of.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A memory device comprising an array of rows and columns of memory cells formed in a face of a semiconductor body, the major part of said array being a data memory and a minor part of the array being an address memory, a commutator for sequentially addressing said rows one at a time and means for reading out address and data from columns when a row is addressed, a serial access register connected via transfer means to the means for reading out to receive data from columns of said array, address input means in said face and connected to receive a multibit address from external to the device, comparator means in said face responsive to an address in said address input means and to said means for reading out and producing a command when the address from external is the same as the address from the array, means to activate said transfer means for the serial access register in response to said command, and output means for reading said data from the serial access register to external to the device.

2. A memory device according to claim 1 wherein said memory cells are read/write cells of the one-transistor dynamic type.

3. A memory device according to claim 2 wherein means are provided for writing data into said serial access register from external to the device.

4. A memory device according to claim 3 wherein means are provided for inserting said multibit address from the address input means into said address memory part of the array in response to said command.

5. A memory device according to claim 4 wherein the means for reading out includes a bistable differential sense amplifier at the center of each column of the array.

6. A memory device according to claim 5 including means for actuating said sense amplifiers for refresh in response to sequential addressing of the rows by said commutator.

7. A memory device according to claim 1 wherein the data memory part of the array includes M rows and N columns, the serial access register includes N stages, and the address memory part of the array includes M rows, when M and N are integral powers of two.

8. A memory device comprising an array of rows and columns of memory cells formed in a face of a semiconductor body, the major part of said array being a data memory and a minor part of the array being an address memory, a commutator for sequentially addressing said rows one at a time and means for reading out address and data from columns when a row is addressed, a serial access register connected via transfer means to the means for reading out to receive data from columns of said array, address input means in said face and connected to receive a multibit address from external to the device, comparator means in said face responsive to an address at said address input means and to said means for reading out and producing a command when the address from external is the same as the address from the array, means to activate said transfer means for the serial access register in response to said command, output means for reading said data from the serial access register to external to the device, a programmable transistor connected to each row and coupled to blanking means, and means to program such transistor if one or more cells in such row test bad.

9. A memory device according to claim 8 including means for inhibiting the storage of data and address in memory cells of a row in response to said blanking means.

10. A memory device according to claim 9 wherein each said programmable transistor is a floating gate electrically-programmable MOS transistor, and means are included on said face for applying a programming voltage to the source-to-drain path of the MOS transistors when said commutator addresses a row which includes one or more bad cells.

11. A memory device comprising an array of rows and columns of memory cells formed in a face of a semiconductor body, the major part of said array being a data memory and a minor part of the array being an address memory, means for addressing said rows one at a time and output means for reading out address and data from columns when a row is addressed, an access register connected via transfer means to said output means to receive data from columns of said array, address input means in said face and connected to receive a multibit address from external to the device, comparator means in said face responsive to an address at said address input means and to said output means and producing a command when the address from external is the same as the address from the array via said output means, means to activate said transfer means for the access register in response to said command, and means for reading said data from the access register to external to the device.

12. A memory device according to claim 11 wherein said memory cells are read/write cells of the one-transistor dynamic type.

13. A memory device according to claim 12 wherein means are provided for writing data into said serial access register from external to the device.

14. A memory device according to claim 13 wherein means are provided for inserting said multibit address from the address input means into said address memory part of the array.

15. A memory device according to claim 13 wherein the output means includes a bistable differential sense amplifier at the center of each column of the array.

16. A memory device according to claim 15 including means for actuating said sense amplifiers for refresh in response to sequential addressing of the rows by said commutator.

17. A memory device according to claim 11 wherein the data memory part of the array includes M rows and N columns, the access register includes N stages, and the address memory part of the array includes M rows, when M and N are integral powers of two.

18. A memory device according to claim 11 including a programmable device connected to each row and coupled to blanking means, and means to program such programmable device if one or more cells in such row test bad.

19. A memory device according to claim 18 including means for inhibiting the storage of data and address in memory cells of a row in response to said blanking means.

20. A memory device according to claim 19 wherein each said programmable device is a floating gate electrically-programmable MOS transistor, and means are included on said face for applying a programing voltage to the source-to-drain path of the MOS transistors when said commutator addresses a row which includes one or more bad cells.

21. A memory device comprising an array of rows and columns of memory cells formed in a face of semiconductor body, means for addressing said rows one at a time and output means for reading out data from columns when a row is addressed, an access register connected via transfer means to the output to receive data from columns of said array, address input means in said face and connected to receive a multibit address from external to the device, means in said face responsive to an address in said address input means and producing a command when the address from external is of predetermined character, means to activate said transfer means for the access register in response to said command, and means for reading said data from the access register to external to the device programmble means connected to each row and coupled to blanking means, and means to program said programmable means if one or more cells in a row test bad.

22. A memory device according to claim 21 including means for inhibiting the storage of data in memory cells of a row in response to said blanking means.

23. A memory device according to claim 22 wherein each said programmable device is a floating gate electrically-programmable MOS transistor, and means are included on said face for applying a programming voltage to the source-to-drain path of the MOS transistors.

* * * * *